(12) United States Patent
Lu et al.

(10) Patent No.: US 11,567,133 B2
(45) Date of Patent: Jan. 31, 2023

(54) SIGNAL DETECTING CIRCUIT AND SIGNAL DETECTING METHOD OF MICRO SWITCH

(71) Applicants: DEXIN ELECTRONIC LTD., Guangdong (CN); DEXIN CORPORATION, New Taipei (TW)

(72) Inventors: Ho-Lung Lu, New Taipei (TW); Shu-Sheng Chen, New Taipei (TW)

(73) Assignees: DEXIN ELECTRONIC LTD., Guangdong (CN); DEXIN CORPORATION, New Taipei (TW)

( * ) Notice: Subject to any disclaimer, the term of this patent is extended or adjusted under 35 U.S.C. 154(b) by 573 days.

(21) Appl. No.: 16/687,695

(22) Filed: Nov. 19, 2019

(65) Prior Publication Data

US 2020/0319251 A1    Oct. 8, 2020

(30) Foreign Application Priority Data

Apr. 8, 2019 (TW) .................................. 108112084

(51) Int. Cl.
| | |
|---|---|
| *G01R 31/327* | (2006.01) |
| *B81B 7/00* | (2006.01) |
| *H01H 1/58* | (2006.01) |
| *G01R 31/50* | (2020.01) |

(52) U.S. Cl.
CPC ............ *G01R 31/327* (2013.01); *B81B 7/008* (2013.01); *G01R 31/50* (2020.01); *H01H 1/58* (2013.01); *B81B 2201/01* (2013.01)

(58) Field of Classification Search
CPC ................................................... G01R 31/327
See application file for complete search history.

(56) References Cited

U.S. PATENT DOCUMENTS

| | | | | |
|---|---|---|---|---|
| 2018/0172766 | A1* | 6/2018 | Guziak | ................ G01R 27/205 |
| 2018/0210564 | A1* | 7/2018 | Chen | ................... G06F 3/03543 |

FOREIGN PATENT DOCUMENTS

| | | | | |
|---|---|---|---|---|
| CN | 2700963 | Y | * | 5/2005 |
| CN | 2758785 | Y | * | 5/2005 |
| CN | 2762331 | Y | * | 6/2006 |
| CN | 102654540 | A | * | 9/2012 |
| CN | 104297678 | A | * | 1/2015 |
| CN | 204968009 | U | * | 1/2016 |

(Continued)

*Primary Examiner* — Patrick Assouad
*Assistant Examiner* — Demetrius R Pretlow
(74) *Attorney, Agent, or Firm* — Li & Cai Intellectual Property Office

(57) ABSTRACT

A signal detecting circuit of a micro switch includes a first terminal, a second terminal, a third terminal and a micro controller. The first terminal has two ends that are respectively connected to a normally closed terminal of the micro switch and a resistor. The second terminal has two ends that are respectively connected to a normally opened terminal of the micro switch and a ground. The third terminal is connected to a common terminal of the micro switch. The micro controller has two ends that are respectively connected to the first terminal and the third terminal. When an elastic plate of the micro switch is pressed down, the common terminal is connected to the normally opened terminal. When the elastic plate of the micro switch is released, the common terminal is connected to the normally closed terminal.

5 Claims, 4 Drawing Sheets

(56) References Cited

FOREIGN PATENT DOCUMENTS

| CN | 105372584 | A | * | 3/2016 | |
|---|---|---|---|---|---|
| CN | 104297678 | B | * | 2/2017 | |
| CN | 106405406 | A | * | 2/2017 | ......... G01R 31/3277 |
| CN | 106546149 | A | * | 3/2017 | ............... G01B 5/02 |
| CN | 106646211 | A | * | 5/2017 | ............... G01B 5/02 |
| CN | 106772011 | A | * | 5/2017 | ............... G01B 5/02 |
| CN | 107393076 | A | * | 11/2017 | |
| CN | 107402348 | A | * | 11/2017 | |
| CN | 108872846 | A | * | 11/2018 | |
| CN | 109225948 | A | * | 1/2019 | .............. B07C 5/344 |
| CN | 109444732 | A | * | 3/2019 | ........... G01R 1/0416 |
| CN | 109490587 | A | * | 3/2019 | ........... G01R 1/0416 |
| CN | 109633432 | A | * | 4/2019 | ......... G01R 31/3277 |
| DE | 4420665 | A1 | * | 12/1994 | ............. H01H 13/12 |
| JP | H1075928 | A | * | 3/1998 | |
| JP | H11263600 | A | * | 9/1998 | |

* cited by examiner

SIGNAL DETECTING CIRCUIT AND SIGNAL DETECTING METHOD OF MICRO SWITCH

CROSS-REFERENCE TO RELATED PATENT APPLICATION

This application claims the benefit of priority to Taiwan Patent Application No. 108,112,084, filed on Apr. 8, 2019. The entire content of the above identified application is incorporated herein by reference.

Some references, which may include patents, patent Applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a signal detecting circuit and a signal detecting method of a micro switch, and more particularly to a signal detecting circuit and a signal detecting method of a micro switch which determines an action of the micro switch according to two signals.

BACKGROUND OF THE DISCLOSURE

A miniature snap-action switch (known as a micro switch) has small spacing between contact points and a snap action structure, and operates in an apparatus or a circuit that is required to be frequently switched such as a computer mouse or a refrigerator. Although the miniature snap-action switch is small, it is irreplaceable.

FIG. 1 is a schematic view of a conventional micro switch. As shown in FIG. 1, the conventional micro switch 10 includes a case body 11, an elastic plate 12, a common (COM) terminal 13, a normally closed (NC) terminal 14 and a normally opened (NO) terminal 15. FIG. 2 is a schematic view of a conventional signal detecting circuit of a micro switch. As shown in FIG. 2, the conventional signal detecting circuit 20 includes three terminals 201 that are respectively connected to the COM terminal 13, the NC terminal 14 and the NO terminal 15 of the conventional micro switch 10. When the COM terminal 13 and the NO terminal 15 are in an ON state, the signal detecting circuit 20 determines that the elastic plate 12 of the micro switch 10 is pressed down. When the COM terminal 13 and the NO terminal 15 are in the ON state, the signal detecting circuit 20 determines that the elastic plate 12 of the micro switch 10 is released.

However, after the micro switch 10 has been used for a while or when the micro switch 10 is quickly switched, the abovementioned pressing-down and/or releasing mechanism of the conventional micro switch could likely produce a misjudgment.

Therefore, a signal detecting circuit of a micro switch of the present disclosure is provided to effectively solve the aforesaid problems.

SUMMARY OF THE DISCLOSURE

In response to the above-referenced technical inadequacies, the present disclosure provides a signal detecting circuit and a signal detecting method of a micro switch.

In one aspect, the present disclosure provides a signal detecting circuit of a micro switch that includes a first terminal, a second terminal, a third terminal and a micro controller. The first terminal has two ends that are respectively connected to a normally closed terminal of the micro switch and a resistor. The second terminal has two ends that are respectively connected to a normally opened terminal of the micro switch and a ground. The third terminal is connected to a common terminal of the micro switch. The micro controller has two ends that are respectively connected to the first terminal and the third terminal. When an elastic plate of the micro switch is pressed down, the common terminal is connected to the normally opened terminal. When the elastic plate of the micro switch is released, the common terminal is connected to the normally closed terminal.

In certain embodiments, the present disclosure provides a signal detecting circuit of the micro switch. When the common terminal is connected to the normally closed terminal, the micro controller detects a high potential signal at both the first terminal and the third terminal. When the common terminal is connected to the normally opened terminal, the micro controller detects a low potential signal at both the first terminal and the third terminal.

In one aspect, the present disclosure provides a signal detecting method of a micro switch including: connecting a first terminal of a signal detecting circuit to a normally closed terminal of the micro switch; connecting a second terminal of the signal detecting circuit to a normally opened terminal of the micro switch; and connecting a third terminal of the signal detecting circuit to a common terminal of the micro switch. When the common terminal of the micro switch is connected to the normally closed terminal, a micro controller of the signal detecting circuit detects a high potential signal at both the first terminal and the third terminal. When the common terminal of the micro switch is connected to the normally opened terminal, the micro controller of the signal detecting circuit detects a low potential signal at both the first terminal and the third terminal. The micro controller determines that an elastic plate does not perform any action when one of the following situations occurs: the micro controller detects the high potential signal and the low potential signal at the first terminal and the third terminal, respectively; and the micro controller detects the low potential signal and the high potential signal at the first terminal and the third terminal, respectively.

In certain embodiments, the present disclosure provides a signal detecting method of the micro switch. When the micro controller detects the low potential signal at both the first terminal and the third terminal, the elastic plate of the micro switch is pressed down. When the micro controller detects the high potential signal at both the first terminal and the third terminal, the elastic plate of the micro switch is released.

Therefore, by virtue of "determining the action of the elastic plate of the micro switch according to two signals" of the present disclosure, the determination can be much faster and more precise than merely according to one signal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
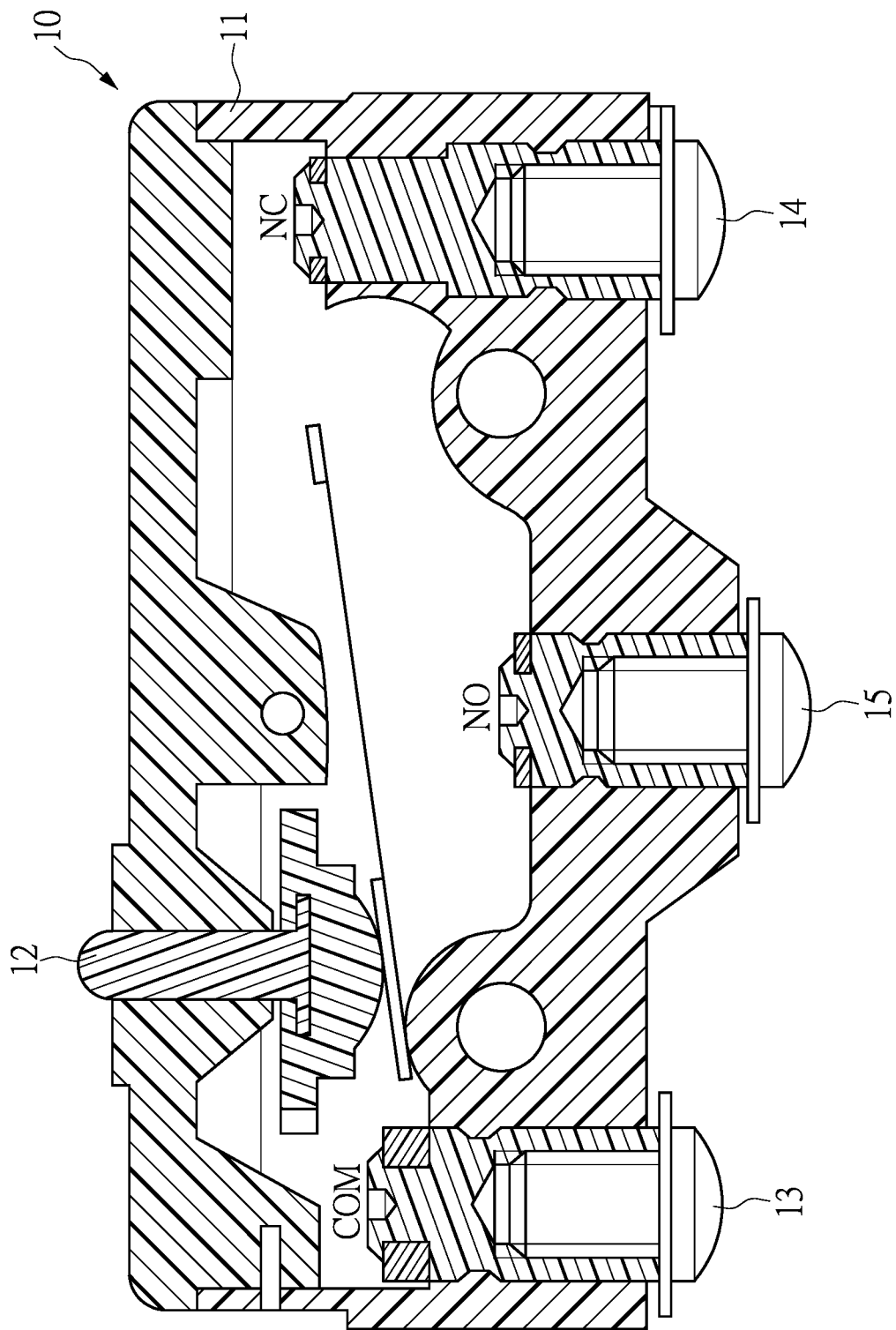
FIG. 1 is a schematic view of a conventional micro switch.
Figure 2:
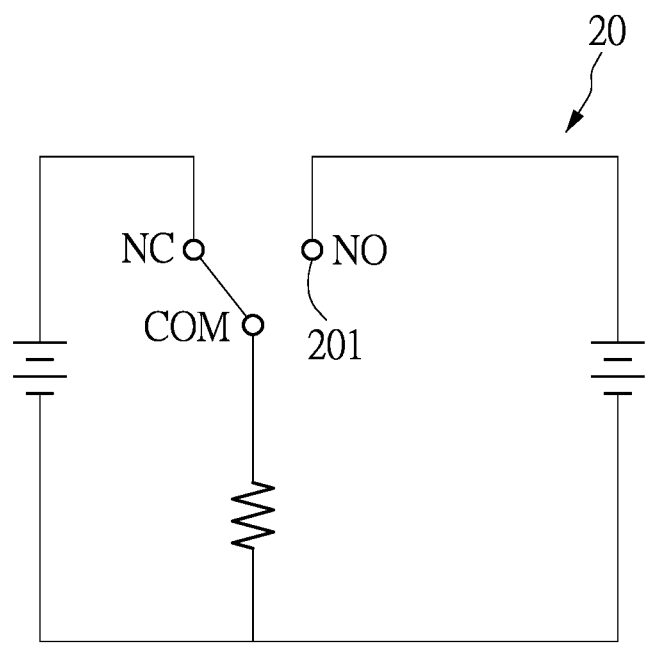
FIG. 2 is a schematic view of a conventional signal detecting circuit of a micro switch.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Signal Detecting Circuit

Figure 3A:
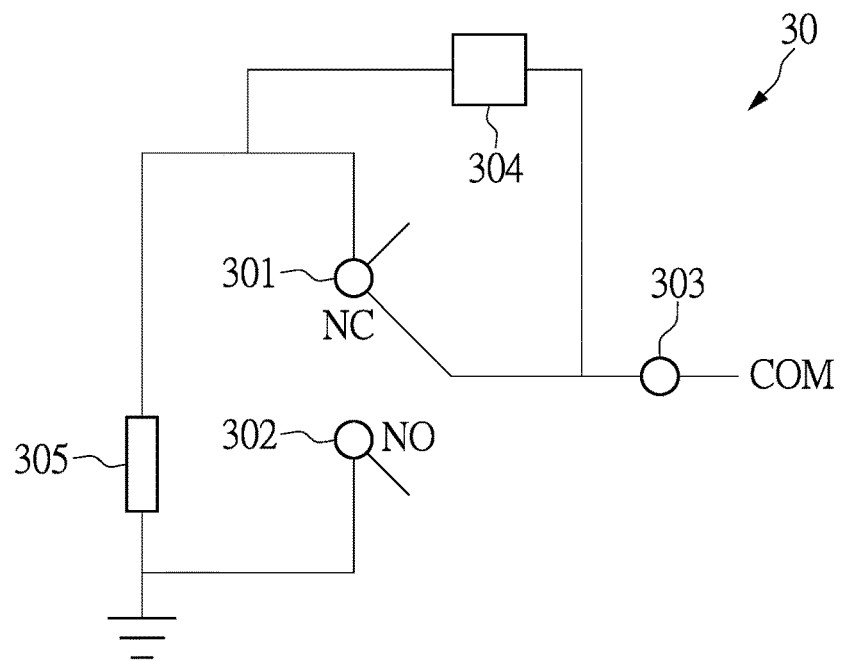
FIG. 3A is a circuit diagram when an elastic plate of a micro switch according to an embodiment of the present disclosure is released.
Figure 3B:
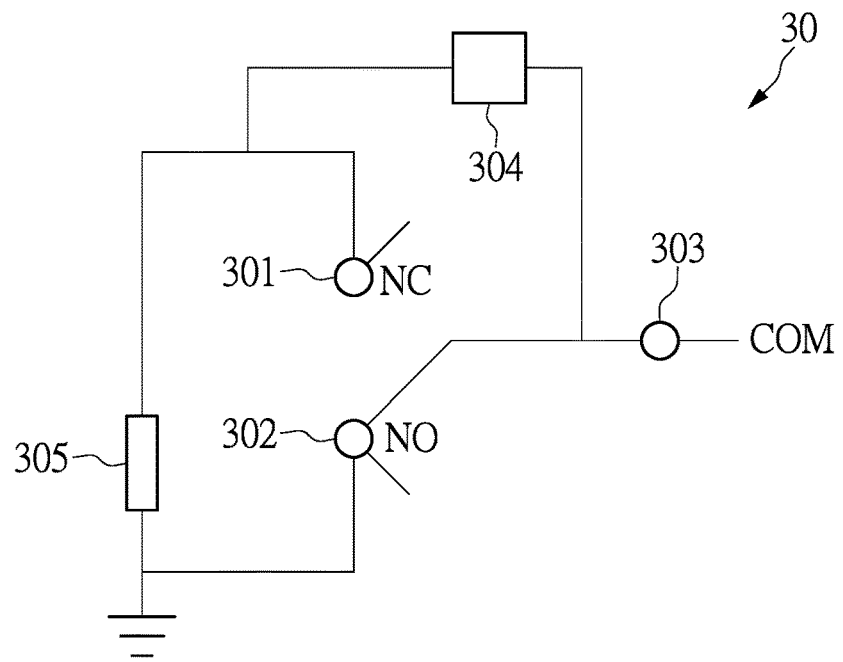
FIG. 3B is a circuit diagram when the elastic plate of the micro switch according to the embodiment of the present disclosure is pressed down.

FIG. 3A is a circuit diagram when an elastic plate of a micro switch according to an embodiment of the present disclosure is released. FIG. 3B is a circuit diagram when the elastic plate of the micro switch according to the embodiment of the present disclosure is pressed down.

Referring to FIG. 3A and FIG. 3B, a signal detecting circuit 30 of a micro switch according to an embodiment of the present disclosure includes a first terminal 301, a second terminal 302, a third terminal 303 and a micro controller 304. The first terminal 301 has two ends that are respectively connected to a normally closed (NC) terminal of the micro switch and a resistor 305. The resistor 305 preferably has a resistance of 1M. The second terminal 302 has two ends that are respectively connected to a normally opened (NO) terminal of the micro switch and a ground. The third terminal 303 is connected to a common (COM) terminal of the micro switch. The micro controller 304 has two ends that are respectively connected to the first terminal 301 and the third terminal 303.

Referring to FIG. 3A, when the elastic plate of the micro switch is released, the COM terminal is connected to the NC terminal, and the micro controller 304 detects a high potential signal at both the first terminal 301 and the third terminal 303 (i.e., signal is 11). When the elastic plate of the micro switch is pressed down, the COM terminal is connected to the NO terminal, the micro controller 304 detects a low potential signal (or no signal at all) at both the first terminal and the third terminal (i.e., signal is 00). However, the micro controller 304 determines that the elastic plate does not perform any action or that the elastic plate has an erroneous action when one of the following situations occurs: the micro controller 304 detects the high potential signal and the low potential signal at the first terminal and the third terminal, respectively (i.e., signal is 10); and the micro controller detects the low potential signal and the high potential signal at the first terminal and the third terminal, respectively (i.e., signal is 01). In other words, the elastic plate of the micro switch is not pressed down nor released. Or, the signal detected by the micro controller 304 is a false signal. That is to say, if the micro controller 304 detects at the first terminal and the third terminal the high potential signal and the low potential signal, respectively, or the low potential signal and the high potential signal, respectively, the micro controller 304 determines that the elastic plate does not perform any action since the elastic plate is not pressed down nor released.

Compared with the conventional micro switch that determines if the elastic plate is pressed or released according to merely one signal, the micro switch of the present disclosure determines the action of the elastic plate of the micro switch according to two signals, which makes the determination much faster and more precise.

Therefore, by virtue of the signal sensing circuit 30 of the present disclosure, the micro switch can be applied in electronic devices requiring a high speed response (such as gaming mice). Moreover, the micro switch of the present disclosure can prevent poor contact between the elastic plate and the contact point due to an electric wear-and-tear of the micro switch from occurring, and thereby avoids the possibility of misjudgments of the electronic device.

Signal Detecting Method

Figure 4:
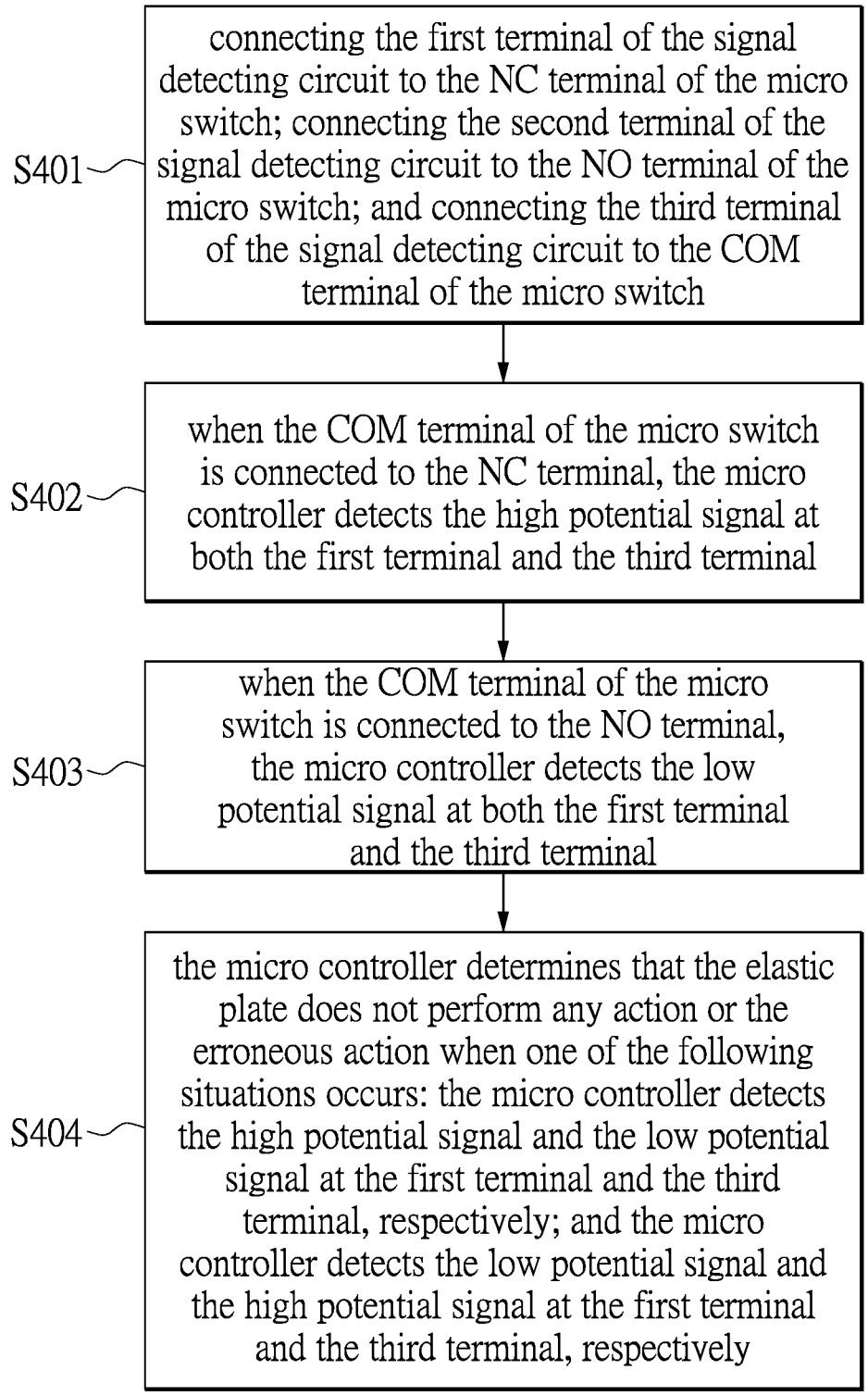
FIG. 4 is a flow chart of a signal detecting method of the micro switch according to the embodiment of the present disclosure.

FIG. 4 is a flow chart of a signal detecting method of the micro switch according to the embodiment of the present disclosure. As shown in FIG. 4, the step S401 is to connect a first terminal 301 of a signal detecting circuit 30 to a normally closed (NC) terminal of the micro switch, to connect a second terminal 302 of the signal detecting circuit 30 to a normally opened (NO) terminal of the micro switch, and to connect a third terminal 303 of the signal detecting circuit to a common (COM) terminal of the micro switch. In step S402, when the elastic plate of the micro switch is released, the COM terminal of the micro switch is connected to the NC terminal, the micro controller 304 of the signal detecting circuit 30 detects the high potential signal at both the first terminal 301 and the third terminal 303. Specifically, when the elastic plate of the micro switch is released, the COM terminal of the micro switch and the NC terminal are conductive (i.e., in an ON state), the micro controller 304 of the signal detecting circuit 30 detects the high potential signal at both the first terminal 301 and the third terminal 303, such that the signal detecting circuit 30 will be informed that the elastic plate of the micro switch is released.

In step S403, when the elastic plate of the micro switch is pressed down, the COM terminal of the micro switch is connected to the NO terminal, the micro controller 304 of the signal detecting circuit 30 detects the low potential signal at both the first terminal 301 and the third terminal 303. Specifically, when the elastic plate of the micro switch is pressed down, the COM terminal of the micro switch and the NO terminal are conductive (i.e., in an ON state), the micro controller 304 of the signal detecting circuit 30 detects the low potential signal at both the first terminal 301 and the third terminal 303, such that the signal detecting circuit 30 will be informed that the elastic plate of the micro switch is pressed down. In step S404, the micro controller 304 determines that the elastic plate does not perform any action or the erroneous action when one of the following situations occurs: the micro controller 304 detects the high potential signal and the low potential signal at the first terminal 301 and the third terminal 303, respectively; and the micro controller 304 detects the low potential signal and the high potential signal at the first terminal 301 and the third terminal 303, respectively.

Beneficial Effect of the Embodiments

Compared with the conventional micro switch that determines if the elastic plate is pressed or released according to merely one signal, the micro switch of the present disclosure determines the action of the elastic plate of the micro switch according to two signals, which makes the determination much faster and more precise.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A signal detecting circuit of a micro switch, comprising:
    a first terminal having two ends that are respectively connected to a normally closed terminal of the micro switch and a resistor;
    a second terminal having two ends that are respectively connected to a normally opened terminal of the micro switch and a ground;
    a third terminal connected to a common terminal of the micro switch; and
    a micro controller having two ends that are respectively connected to the first terminal and the third terminal,
    wherein when an elastic plate of the micro switch is pressed down, the common terminal is connected to the normally opened terminal; and when the elastic plate of the micro switch is released, the common terminal is connected to the normally closed terminal;
    wherein the micro controller determines that the elastic plate does not perform any action or that the elastic plate performs an erroneous action when one of the following situations occurs: the micro controller detects a high potential signal and a low potential signal at the first terminal and the third terminal, respectively; and the micro controller detects the low potential signal and the high potential signal at the first terminal and the third terminal, respectively.

2. The signal detecting circuit of the micro switch according to claim 1, wherein when the common terminal is connected to the normally closed terminal, the micro controller detects the high potential signal at both the first terminal and the third terminal; and
    when the common terminal is connected to the normally opened terminal, the micro controller detects the low potential signal at both the first terminal and the third terminal.

3. A signal detecting method of a micro switch, comprising:
    connecting a first terminal of a signal detecting circuit to a normally closed terminal of the micro switch;
    connecting a second terminal of the signal detecting circuit to a normally opened terminal of the micro switch; and
    connecting a third terminal of the signal detecting circuit to a common terminal of the micro switch;
    wherein when the common terminal of the micro switch is connected to the normally closed terminal, a micro controller of the signal detecting circuit detects a high potential signal at both the first terminal and the third terminal;
    wherein when the common terminal of the micro switch is connected to the normally opened terminal, the micro controller of the signal detecting circuit detects a low potential signal at both the first terminal and the third terminal;
    wherein the micro controller determines that an elastic plate does not perform any action when one of the following situations occurs: the micro controller detects the high potential signal and the low potential signal at the first terminal and the third terminal, respectively; and the micro controller detects the low potential signal and the high potential signal at the first terminal and the third terminal, respectively.

4. The signal detecting method of the micro switch according to claim 3, wherein when the micro controller detects the low potential signal at both the first terminal and the third terminal, the elastic plate of the micro switch is pressed down; and when the micro controller detects the high potential signal at both the first terminal and the third terminal, the elastic plate of the micro switch is released.

5. The signal detecting method of the micro switch according to claim 3, wherein the micro controller determines that the elastic plate has an erroneous action when one of the following situations happens: the micro controller detects the high potential signal and the low potential signal at the first terminal and the third terminal, respectively; and the micro controller detects the low potential signal and the high potential signal at the first terminal and the third terminal, respectively.

* * * * *